United States Patent [19]
Crosby

[11] 3,939,434
[45] Feb. 17, 1976

[54] WIDEBAND DC CURRENT AMPLIFIER
[75] Inventor: Philip Stephen Crosby, Portland, Oreg.
[73] Assignee: Tektronix, Inc., Beaverton, Oreg.
[22] Filed: Aug. 23, 1974
[21] Appl. No.: 499,824

[52] U.S. Cl. ............... 330/40; 307/297; 330/23; 330/38 M
[51] Int. Cl.² .......................................... H03F 3/04
[58] Field of Search......... 330/19, 22, 23, 25, 38 M, 330/40; 307/296, 297

[56] References Cited
UNITED STATES PATENTS

| | | | |
|---|---|---|---|
| 3,364,434 | 1/1968 | Widlar | 330/22 |
| 3,660,694 | 5/1972 | Lucas | 330/22 X |
| 3,706,852 | 12/1972 | Angus | 330/141 X |

Primary Examiner—James B. Mullins
Attorney, Agent, or Firm—Adrian J. LaRue

[57] ABSTRACT

A wideband DC current amplifier comprising a pair of transducers, the collector of the input transistor being connected to it's base through a compensating resistance and directly to the base of a second transistor is provided.

1 Claim, 3 Drawing Figures

WIDEBAND DC CURRENT AMPLIFIER

BACKGROUND OF THE INVENTION

It is well known to those in the art that the most difficult problems associated with DC current amplifiers or wideband DC current amplifiers are the gain and drift variations which occur as functions of temperature and other parameters. Gain variations can practically be eliminated by various known feedback arrangements, but drift variation such as operating point instability poses a more difficult problem. Transistor type amplifiers amplify the problem of drift variation due to the temperature dependence of the transistor parameters such as for example, current gain ($h_{FE}$), base-emitter voltage ($V_{BE}$) and leakage current ($I_{CBO}$). In precision electronic equipment such as a cathode-ray-oscilloscope which is a measuring device having characteristics to display an analogue of an electrical event, it is essential that circuits associated with, say, the horizontal deflectionn system in the measuring device provide accurate and stabilized signals so that equal increments of horizontal distance represent equal increments of time. Obviously, some compensation technique must be used to reduce jitter, etc. In accordance with prior art, a number of techniques are available to lower the drift variation and include chopper stabilization, individual temperature compensation, and temperature stabilization. These techniques, however, have limitations such as complexity, not being suited to volume production and require high quality temperature stable parts making them quite expensive. Several of the compensation schemes presently used are fully described in "Amplifier Handbook," Richard F. Shea, Editor-in-Chief, McGraw-Hill Book Company, copyright 1966.

SUMMARY OF THE INVENTION

The present invention is an improvement over prior art compensation schemes in that a resistor is used to provide compensation for the variation in base to collector current ratios. Accordingly, a pair of transistors comprising the wideband DC current amplifier are connected so that the collector of the input transistor is connected to its base through a series compensating resistance and directly to the base of the second transistor. As the result of such improvement, input current is mirrored to the output and provides optimum performance. In addition, the produced variation increases the bandwidth of such.

It is therefore an object of the present invention to provide an improved wideband DC current amplifier.

It is another object of the present invention to provide an improved wideband DC current amplifier suitable for volume production.

It is another object of the present invention to provide an improved wideband DC current amplifier which is extremely simple and economical.

The foregoing and numerous other objects, advantages, and inherent functions of the present invention will become apparent as the same is more fully understood from the following description and drawings wherein like characters refer to like elements and which describes the preferred embodiment of the invention; it is to be understood, however, that this embodiment is not intended to be exhausting nor limiting of the invention but is given for purposes of illustration in order that others skilled in the art may fully understand the invention and principles thereof and the manner of applying it in practical use so that they may modify it in various forms, each as may be best suited to the conditions of the particular use.

DESCRIPTION OF INVENTION

Figure 1:
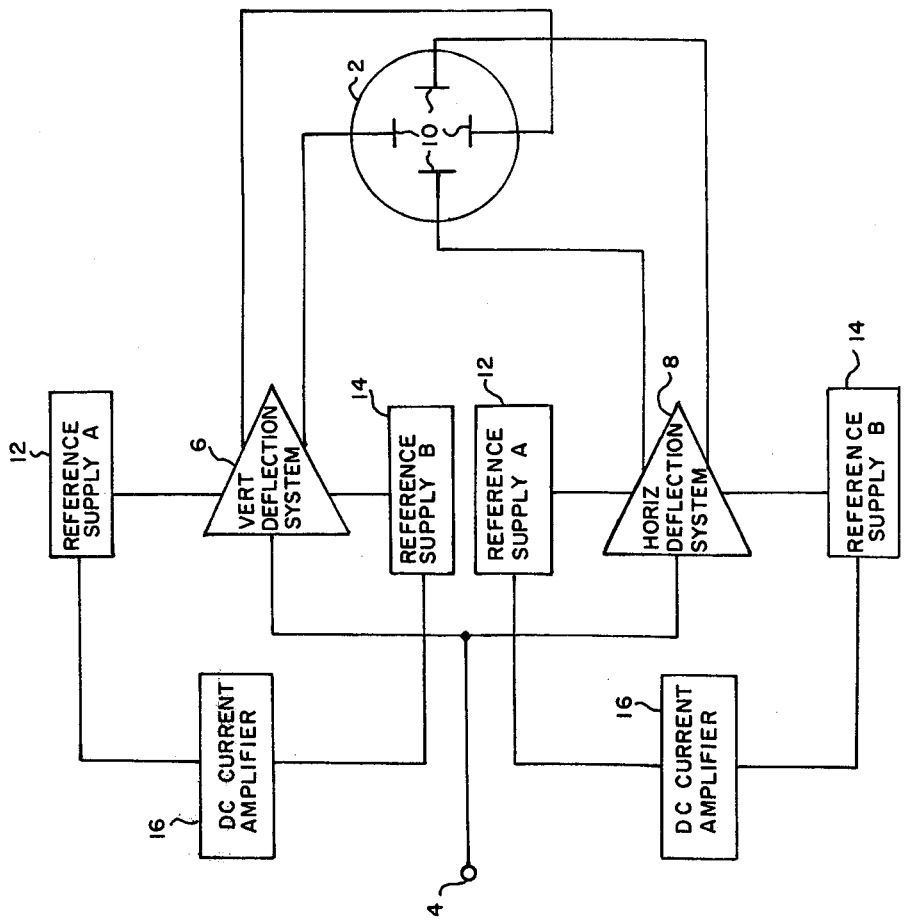
FIG. 1 is a block diagram of a display apparatus to illustrate the use of a DC current amplifier.

Referring now to the drawings and in particular FIG. 1, there is shown in block diagram form a display apparatus including a display means 2 such as a cathode-ray-tube for displaying an analogue of an electrical event in response to an electrical input signal applied to the apparatus by way of input terminal 4. The analogue of the electrical input signal is provided by applying signal waveforms generated by a vertical deflection system 6 and a horizontal deflection system 8 to vertical and horizontal deflection plates 10 within the display means 2. The aforementioned deflection means are referenced to set sources of suitable electrical potential defining reference supply A and reference supply B hereinafter referred to as supply 12 and 14, respectively. Disposed between each set of supply 12, 14 is a DC current amplifier 16 to be hereinafter discussed. DC current amplifier 16 senses any change in current of say, the supply 12 and forces an identical change in the supply 14 or viceversa, thus keeping the two supplies at the same point relative to each other. As a result of such conventional technique, circuits which are included to form the vertical and horizontal deflection systems disposed between the supplies are inhibited from changing operating points and gain. For a complete detailed description of such an apparatus just described, reference should be made to a series of reference material books under the general title of "Circuit Concepts," Tektronix, Inc.

Figure 2:
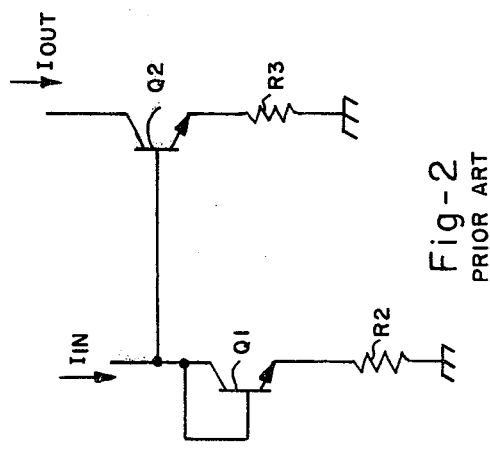
FIG. 2 is a schematic diagram of one embodiment of a DC current amplifier in accordance with the prior art.

Referring now to FIG. 2 there is shown a schematic diagram of the DC current amplifier in accordance with the prior art which has been heretofore used as the DC current amplifier 16 of the FIG. 1 embodiment. A pair of transistors $Q_1$, $Q_2$ which can be discrete or in the form of an integrated circuit have their emitters connected to a source of potential (shown as ground for purposes of explanation only) via resistors $R_2$ and $R_3$, respectively. The base of transistor $Q_1$ is directly connected to the collector of same and as such is commonly referred to as being diode connected and operated. The diode-connected transistor $Q_1$ therefore provides the bias voltage for a current source transistor $Q_2$ in that the collector of $Q_1$ is also directly connected to the base of the transistor $Q_2$. If $R_2 = R_3$, the bases of both $Q_1$ and $Q_2$ will be at the same potential since they are both connected together. Assuming both transistors are closely located on an integrated chip, have areas proportional to the current flowing through them, etc., the current $I_{in}$ is reproduced at the collector of $Q_2$ as $I_{out}$. However, it can be shown or which is described in previously mentioned handbook that the mirror current Iout is virtually independent of current gains, etc., provided that the Beta's (B) of the transistors are quite large. Additionally, as is well known, the frequency response of such a circuit is also very much Beta dependent.

Figure 3:
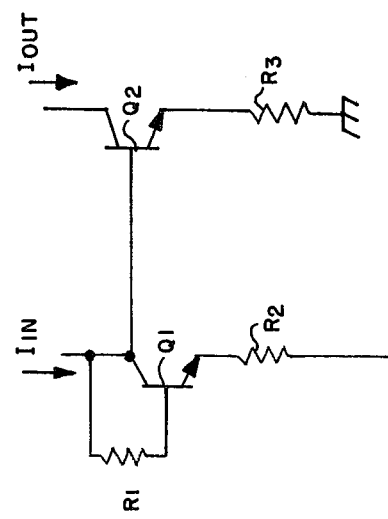
FIG. 3 is a schematic diagram of the DC current amplifier in accordance with the present invention.

The embodiment of FIG. 3, which is the preferred embodiment of the present invention also includes a pair of transistors $Q_1$, $Q_2$ and emitter resistors $R_2$ and $R_3$. The base of $Q_1$ is connected via series resistor $R_1$ to the collector of same. The collector of $Q_1$ is also directly connected to the base of $Q_2$. As can be discerned from the FIG. 3 embodiment, an additional resistance means $R_1$ has been added and such resistor defines a compensating means which greatly improves the prior art DC current amplifiers. In addition, the use of a resistor rather than an additional transistor makes such improvement much less expensive. Additionally, it is obvious that fabrication of such in an integrated circuit is quite easily accomplished which tends to make volume production a way of being.

Understanding circuit operation requires that the ratio of base current to collector current is zero for both $Q_1$ and $Q_2$. Thus, current Iout would obviously be defined by the ratio of $R_2 : R_3$ multiplied by Iin, since collector current in each transistor is equal to the emitter current, and the voltage drops across $R_2$ and $R_3$ are equal. If the ratio of base current to collector current assumes a finite value substantially less than unity and such ratio is the same for each transistor, a voltage will be developed across the resistor $R_1$. If Iout equals a number M multiplied by Iin, the ratio of $R_2 : R_3$ equals M, and the ratio of $R_1 : R_2$ defines M + 1, it can be shown using Kirchoff's laws that a decrease of voltage across $R_2$ equal to the base current of $Q_2$ multiplied by the resistance $R_2$ will be produced. Furthermore, the voltage at the base of $Q_2$ will increase causing the emitter current of $Q_2$ to increase by an amount necessary to keep the current Iout constant. As the current Iin is repeated as Iout, and since Beta (B) of the transistors have less effect than prior art circuitry, the overall drift and/or stability, and frequency response of the amplifier will be greatly improved.

Tests conducted on the inventive feature of the present invention have indicated that a change in alpha ($\alpha$ easily converts to $\beta$ as is well known) from 0.995 to 0.999 for typical transistors in shielded conditions have indicated output changes ($A_I$) from 4.999152846 to 5.000561347 with $R_1 = 115K\Omega$, $R_2 = 18.7 K\Omega$ and $R_3 = 3.74K\Omega$, whereas the same circuit with $R_1 = 0$ (shorted) have shown output changes from 4.929595828 to 5.049481245. Thus an improvement of only about 0.05 percent, mathematically, representa a usable display verses an unusable display, when say the horizontal deflection system of the FIG. 1 embodiment must operate at X50 magnification.

While there has been shown and described the preferred embodiment of the present invention it will be apparent to those skilled in the art that many changes and modifications may be made thereon or the use thereof. For example, the circuit can be used in instances where, say $F_T$ is 1 GH, and a frequency of 100 MHz is desirable. Therefore, the appended claims are intended to cover all changes and modifications that fall within the true spirit and scope of the invention.

The invention is claimed in accordance with the following:

1. A current amplifier, comprising:
a first and second transistor means, each of said transistor means having a base, a collector, and an emitter;
means directly connecting the collector of said first transistor means to the base of said second transistor means, said means having a resistive value of substantially zero ohms;
first and second resistor means serially connected between the emitters of said first and second transistor means, respectively, and a reference potential;
third resistor means serially connected between the base and collector of said first transistor means, wherein the ratio of said first resistor means to said second resistor means plus unity equals the ratio of said third resistor means to said second resistor means;
means for applying input current to the collector of said first transistor means; and
means for applying a repeated input current to the collector of said second transistor means.

* * * * *

UNITED STATES PATENT OFFICE
CERTIFICATE OF CORRECTION

PATENT NO. : 3,939,434

DATED : February 17, 1976

INVENTOR(S) : PHILIP STEPHEN CROSBY

It is certified that error appears in the above-identified patent and that said Letters Patent are hereby corrected as shown below:

In the Abstract, line 2, "transducers" should be --transistors--

Column 2, line 36, "viceversa" should be --vice versa--

Column 4, line 7, "representa" should be --represents--

Signed and Sealed this eleventh Day of May 1976

[SEAL]

Attest:

RUTH C. MASON
Attesting Officer

C. MARSHALL DANN
Commissioner of Patents and Trademarks